United States Patent [19]

Uchidoi

[11] 3,943,381

[45] Mar. 9, 1976

[54] PULSE GENERATING APPARATUS HAVING A CHATTERING PULSE ELIMINATION CIRCUIT

[75] Inventor: Masanori Uchidoi, Kawasaki, Japan

[73] Assignee: Canon Kabushiki Kaisha, Tokyo, Japan

[22] Filed: Sept. 4, 1973

[21] Appl. No.: 393,895

[30] Foreign Application Priority Data

Sept. 7, 1972 Japan .................................. 47-89799

[52] U.S. Cl. ............. 307/247 A; 307/293; 317/9 C; 328/87

[51] Int. Cl.$^2$ .......................................... H03K 17/56

[58] Field of Search .......... 307/247 A, 293; 328/87; 317/9 C, 11; 340/365 E; 325/170; 324/168, 169, 171

[56] References Cited

UNITED STATES PATENTS

| | | | |
|---|---|---|---|
| 2,970,227 | 1/1961 | Horton et al. | 307/293 |
| 3,365,546 | 1/1968 | Kemper | 325/170 X |
| 3,706,852 | 12/1972 | Angus | 325/170 X |
| 3,725,680 | 4/1973 | Silva | 340/365 E |
| 3,727,141 | 4/1973 | Finlay | 307/247 A |

OTHER PUBLICATIONS

Western Electric Tech Dig. No. 26, Circuit For Eliminating Contact Bounce, by M. Zugay, 4/72, p. 69.

*Primary Examiner*—Stanley D. Miller, Jr.
*Assistant Examiner*—B. P. Davis
*Attorney, Agent, or Firm*—Toren, McGeady and Stanger

[57] ABSTRACT

A pulse generating apparatus which generates rectangular wave signal by opening and closing of a mechanical contact and has a differentiation circuit to output such pulse signal as corresponding to the rising position of said signal. Said apparatus has a rectangular wave generating means to generate rectangular wave signal by opening and closing a mechanical contact, a differentiation circuit to receive the rectangular wave signal from said rectangular wave generating means and to differentiate the same, and a high impedance element connected to the discharge circuit within said differentiation circuit. By this the discharging time constant factor of the differentiation circuit becomes large, sharply reducing the chattering pulse which parasitises to the rectangular wave signal.

13 Claims, 5 Drawing Figures

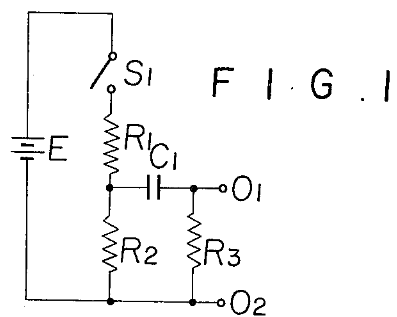
FIG. 1
FIG. 2
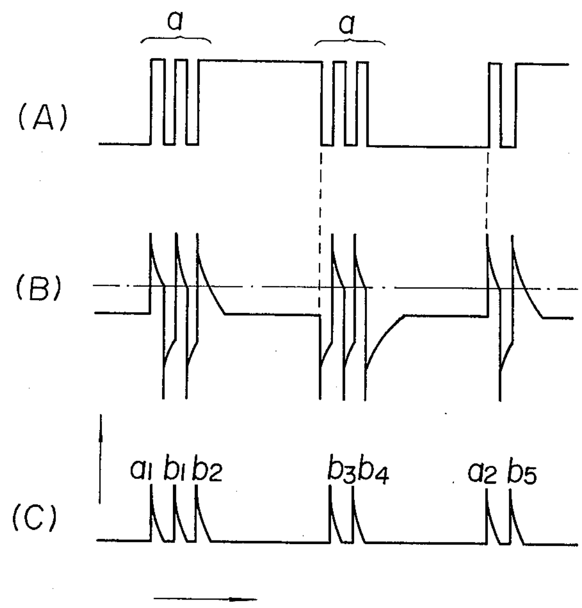
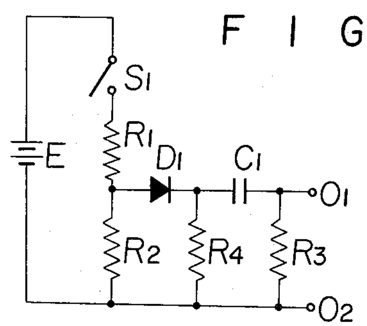
FIG. 3

PULSE GENERATING APPARATUS HAVING A CHATTERING PULSE ELIMINATION CIRCUIT

BACKGROUND OF THE INVENTION

1. Field of the Invention

The present invention relates to a generating apparatus of such pulse signal as corresponding to the building up phase of the rectangular wave signal generated by opening and closing of a mechanical contact, particularly to a pulse generating apparatus having a prevention circuit for erroneous function by chattering, improper contact, etc., at the time of opening and closing of a contact.

2. Description of the Prior Art

An apparatus to generate such pulse signal as corresponding to a rotating speed of a rotating machine by opening and closing a mechanical contact with rotation of the machine to put the current ON or OFF, and to control the rotation of other rotating machines to secure synchronism is generally used as, for example, a synchronizing equipment between a magnetic reproducing machine and a cine-projector, and between a magnetic sound recording equipment and a cine-camera, etc. In such apparatus employing the opening and closing of a mechanical contact, unnecessary pulse may be generated by chattering, improper contact, etc. which take place in opening and closing the contact, and erroneous functioning may be caused thereby, which need to be prevented. That is, when the rectangular wave output generated by opening and closing of a contact is differentiated by a differentiation circuit to make it pulse signal, as it becomes rectangular wave signal accompanying short pulse at the time of opening and closing by chattering, etc. of the contact, if it is simply differentiated to take out such pulse signal as corresponding to the building up phase, false pulse is mixed into normal driving pulse, thereby causing erroneous action in control of the equipment being controlled.

SUMMARY OF THE PRESENT INVENTION

The object of the present invention is to provide a pulse generating apparatus with very simple arrangement, in which the above mentioned short-comings of conventional apparatus are eliminated and such false pulse as causing erroneous functioning will not be mixed in the pulse control signal generated by opening and closing a mechanical contact.

Another object of the present invention is to provide a pulse generating apparatus having a differentiation pulse to differentiate the rectangular wave signal generated by opening and closing of mechanical contact and to generate such pulse signal as corresponding to its building up phase, wherein said rectangular wave signal is impressed to high resistance through a diode connected in series in a normal direction, and the terminal voltage of said high resistance is impressed to the above mentioned differentiation circuit.

Further other objects of the present invention will become clear by the detailed explanation of the invention made below together with explanation of the drawings.

BRIEF DESCRIPTION OF THE DRAWINGS

FIG. 1 is a circuit connection diagram showing an example of a conventional pulse generation apparatus.

FIG. 2 are wave form drawings of each part of the apparatus in FIG. 1.

FIG. 3 is a circuit connection diagram to show an example of the pulse generation apparatus according to the present invention.

DESCRIPTION OF THE PREFERRED EMBODIMENTS

Figure 4:
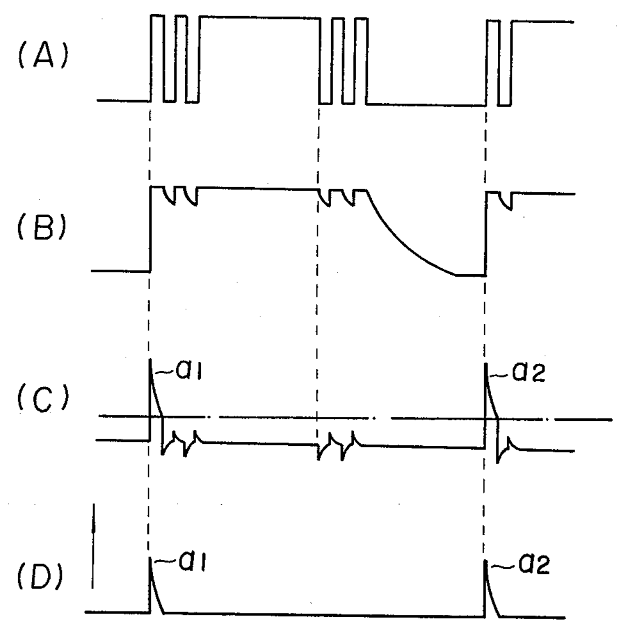
FIG. 4 shows wave forms of each part of the apparatus of FIG. 3.

FIG. 1 is a circuit connection diagram to show an example of a conventional pulse generation apparatus.

In the drawing, E is a power source, $S_1$ is an opening and closing switch by a mechanical contact, for example a drum switch installed to a rotating axle, etc. of the apparatus. $R_1$ and $R_2$ are series resistances employing rectangular wave signal generated at the terminal of the resistance $R_2$. $C_1$ and $R_3$ are a condensor and a resistance composing a differentiation circuit, generating pulse signal between the output terminals $O_1$, $O_2$ utilizing commonly known CR time constant factor.

FIG. 2 are waveform drawing for each part of the apparatus shown in FIG. 1. In this drawing the axis of abscissas shows time while the axis of ordinates shows amplitude. The function of the apparatus in FIG. 1 is such that when the switch $S_1$ is mechanically opened and closed causing chattering, the current being made ON or OFF by the $S_1$ and flows from the power source E to the resistances $R_1$, $R_2$ becomes such rectangular wave as shown in FIG. 2(A). That is, such pulse with small width as shown in the drawing as (a) is accompanied at the time of rising and coming down of the rectangular wave.

When the rectangular wave signal of FIG. 2 (A) is differentiated by such differentiation circuit as shown in FIG. 1, the pulse as shown in FIG. 2 (B) can be obtained. When it is sliced with an appropriate circuit (not shown in the drawing), such pulse in normal direction as shown in FIG. 2 (C) can be obtained. In the drawing $a_1$ and $a_2$ are normal driving pulses, but $b_1$ through $b_5$ are unnecessary pulses, by which the devices controlled are caused to make erroneous function.

Next, FIG. 3 is a circuit connection diagram to show an example of a pulse generating apparatus according to the present invention. Some parts in this drawing as in FIG. 1 are shown with same identification number or code. $D_1$ in the drawing is an element having one way conducting characteristics for example a diode, and $R_4$ is a high resistance, and these parts are different from the apparatus shown in FIG. 1. In the apparatus of this drawing the fact that the reverse direction impedance of the diode $D_1$ has high value is used and by using the same and the high resistance $R_4$ the input end of the differentiation circuit is made to have high impedance, thereby the discharge time constant factor of $C_1$ is made long. FIG. 4 shows wave form of each part of the apparatus shown in FIG. 3. When chattering takes place at the time of opening and closing the mechanical contact $S_1$, the current flowing from the power source E to $R_1$, $R_2$ will become as shown in FIG. 4 (A). When the rectangular wave signal of FIG. 4 (A) is impressed to the high resistance $R_4$ through the diode $D_1$, its output waveform will become as shown in FIG. 4 (B). This is because the discharge time constant factor of $C_1$ becomes long by the diode $D_1$ and the high resistance $R_4$, and as it is differentiated by a differentiation circuit consisting of $C_1$, $R_3$, such pulse as shown in FIG. 4 (C) can be obtained. In the waveform of FIG. 4 (C), the pulses $a_1$, $a_2$ which are in synchronism with the opening and the closing of the switch $S_1$ have distinctly different amplitudes and directions from those in other pulses, therefore by slicing the same such normal pulses $a_1$, $a_2$ only as in FIG. 4 (D) can be obtained. By controlling the equipment to be controlled with the pulse of said waveform, normal synchronized driving can be secured and erroneous function can be prevented.

Figure 5:
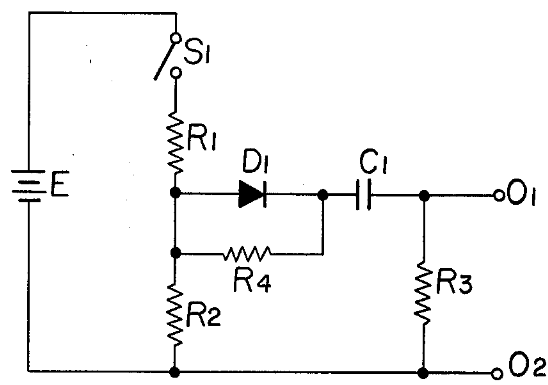
FIG. 5 is a circuit connection diagram to show other example of the pulse generation apparatus according to the present invention.

FIG. 5 is a circuit connection diagram to show another example of the pulse generating apparatus according to the present invention, wherein the high resistance $R_4$ shown in FIG. 3 is connected in parallel with the diode $D_1$. In this case as the electric charge of the condensor $C_1$ is discharged through the high resistance $R_4$, the resistance $R_2$, false pulse caused by chattering, etc. will be eliminated same as in the example shown in FIG. 3.

According to the pulse generating apparatus of the present invention the generation of false pulse caused by the chattering, etc. by opening and closing of a mechanical contact can be prevented by simple circuit as mentioned above, therefore it has great effect as applied to various equipment and is usefully industrially.

What is claimed is:

1. An apparatus for transmitting the movement of a switch from one position to another between one circuit containing the switch and another circuit, said switch having an expected rate of contact bounce, comprising a capacitance, circuit means for connecting said capacitance in series between the one circuit and the other, characterized in that said circuit means includes means for charging said capacitance to a voltage appearing at the switch at a rate at least as fast as the expected contact bounce when the switch assumes one of its positions and for discharging said capacitance at a rate substantially slower than the contact bounce when the switch assumes its other position, said means in said circuit including a unidirectional current carrying member connected in series between the one circuit and the capacitance.

2. An apparatus as in claim 1, wherein said unidirectional member is a diode.

3. An apparatus as in claim 2, wherein said diode is poled for easy current flow to said capacitance when the switch means is closed.

4. An apparatus as in claim 1, wherein said means in said circuit means includes a resistance shunting the other portion of the circuit and having a value sufficiently small to allow charging of the capacitance at a rate faster than the contact bounce rate.

5. A pulse generating apparatus for eliminating contact bounce noise generated by connecting and disconnecting a contact switch and having characteristic repetition times, comprising;

a. differentiating circuit means having an output terminal and at least one capacitor to receive said contact bounce noise;

b. electrical means connecting said differentiating circuit means to said contact switch so as to actuate said differentiating circuit means in response to the connection of said contact switch, and c. impedance means in said electrical means and connected to said differentiating circuit means for forming a discharge path for the capacitor in said differentiating circuit means, said impedance means having a sufficiently high resistance so that said impedance means and said capacitor produce a long time constant substantially longer than the repetition times of the contact bounce noise.

6. A pulse generating apparatus according to claim 5, wherein the impedance means is shunted across said differentiating circuit means.

7. A pulse generating apparatus according to claim 5, wherein said differentiating circuit means comprises a capacitor and a resistor electrically connected in series, said capacitor being operatively coupleable to the electrical power supply means by said contact switch.

8. A pulse generating apparatus according to claim 7, wherein the output terminal is electrically connected to said differentiating circuit means between said capacitor and said resistor.

9. A pulse generating apparatus according to claim 5, wherein said impedance means includes a resistor with high resistance.

10. An apparatus as in claim 9, wherein the time constant of said resistor and capacitor is longer than three times the repetition period of the noise.

11. A pulse generating apparatus for eliminating repetitive contact bounce noise generated by connecting and disconnecting a contact switch, comprising;

a. a D.C. power supply means, b. voltage dividing resistance means connected with and disconnected from said D.C. power source by said contact switch, c. differentiating circuit having an output terminal and at least one capacitor coupled to respond to the bounce noise, and connected across said voltage dividing resistance means, and d. impedance means connected to said differentiating circuit and forming a discharge path for the capacitor in the differentiating circuit, said impedance means having high resistance which, with the capacitor in said differentiating circuit means, forms a time constant longer than the repetition period of the contact bounce noise.

12. A pulse generating apparatus according to claim 11, wherein further comprising a unidirectional current carrying member for connecting said differentiating circuit in parallel with said voltage dividing resistance means in such a manner that the capacitor in said differentiating circuit stores said contact bounce noise.

13. A pulse generating apparatus according to claim 12, wherein said unidirectional current carrying member comprises a diode.

* * * * *